Figure 1:
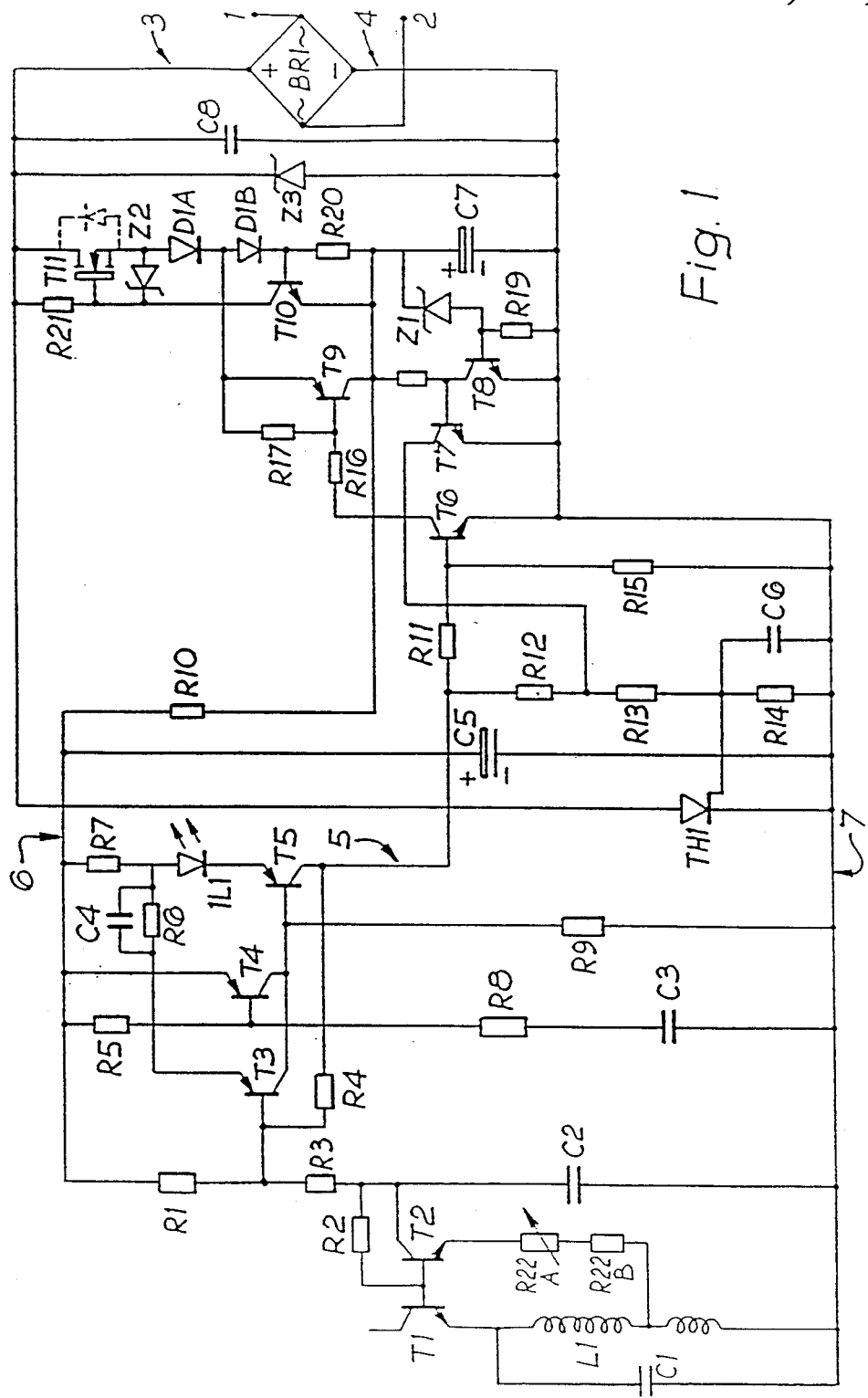

United States Patent [19]

Harris

[11] Patent Number: 4,924,122
[45] Date of Patent: May 8, 1990

[54] LOW LEAKAGE, A.C. PROXIMITY-SWITCH CIRCUIT

[75] Inventor: Geoffrey J. Harris, Swindon, United Kingdom

[73] Assignee: Square D Company, Palatine, Ill.

[21] Appl. No.: 71,228

[22] PCT Filed: Sep. 19, 1986

[86] PCT No.: PCT/GB86/00562
§ 371 Date: May 15, 1987
§ 102(e) Date: May 15, 1987

[87] PCT Pub. No.: WO87/01883
PCT Pub. Date: Mar. 26, 1987

[30] Foreign Application Priority Data

Sep. 24, 1985 [GB] United Kingdom ............... 8523516

[51] Int. Cl.$^5$ .................. H03K 17/30; H03K 17/26; H03K 17/28; H03K 3/013

[52] U.S. Cl. .................. 307/570; 307/116; 307/246; 307/308; 307/547; 307/564; 307/554; 361/179; 361/181

[58] Field of Search ........... 328/5; 307/116, 546–548, 307/554, 564, 570, 246; 340/55; 361/179–181

[56] References Cited

U.S. PATENT DOCUMENTS 4,138,709  2/1979  Colwill .................................. 328/5

FOREIGN PATENT DOCUMENTS 8304458  12/1983  United Kingdom .

OTHER PUBLICATIONS

Paul Richman, "Characteristics and Operation of MOS Field-Effect Devices", McGraw-Hill, 1967, p. 116.
"Commutating and Interfacing with Junction and MOS FETs", by D. Hargrave, Electronic Engineering, pp. 56–59, Dec. 1969.

Primary Examiner—Stanley D. Miller
Assistant Examiner—David R. Bertelson
Attorney, Agent, or Firm—Michael J. Femal

[57] ABSTRACT

A proximity-switch circuit operates a main switch TH1 to pass an ac supply through an external load when a metallic object is near a coil L1 that is part of an oscillator circuit. The oscillator circuit is connected to a level detector circuit controlling the switch TH1. The circuit is powered by a power supply stage that includes a storage capacitor C7, for which the charging current is controlled by a transistor T10 and a MOSFET T11. Upon initial application of the ac supply, the level-detector circuit is overridden by a circuit that includes capacitor C3 and transistor T4 until a predetermined period of time has elapsed, so as to prevent the generation of erroneous "on" signals before the oscillator has stabilized.

4 Claims, 2 Drawing Sheets

LOW LEAKAGE, A.C. PROXIMITY-SWITCH CIRCUIT

This invention relates to proximity switches and particularly, but not exclusively, to the type in which an induction coil is driven by an oscillator and the presence of a metallic object in proximity to the switch causes a change in the amplitude of oscillation which is detected by a detector circuit to close a switching element such as a thyristor or transistor. Such devices are well known in principle, one example being described in our British Pat. No. 1531217.

Another device of this general type is described in our PCT/GB/83/00149, which is particularly concerned with ensuring low power dissipation in and minimum voltage drop across the device in the "on" state.

It is desirable in such switches that the "off" state residual current be minimal, and one object of the present invention is to provide a proximity switch circuit which furthers this aim, and which is applicable to switches utilising an induction coil sensor as described above as well as other sensor types.

A problem associated with switches hitherto known is that, upon initial application of the supply voltage, false "on" signals may be generated prior to stabilisation of the sensing circuitry. It is a further object of the present invention to obviate or mitigate the occurrence or erroneous signals under these conditions.

According to one aspect of the invention, a proximity switch for use with an A.C. supply to control a load connected in series with the switch comprises:

a power supply including a storage capacitor; and a controllable switching element connected, in use, across said AC supply and having a control input;

characterised in that said power supply further includes means for limiting the current charging said storage capacitor to a predetermined maximum value when the switch is "off".

Preferably, said limiting means includes a variable resistance device connected in series with said storage capacitor and means responsive to the level of the charging current for controlling the resistance of said device.

Preferably also, said variable resistance device is a MOSFET and said charging current responsive means controls the MOSFET gate voltage.

Preferably also, said means for controlling the gate voltage of said MOSFET includes a transistor, the base-emitter voltage of said transistor being proportional to the charging current of said storage capacitor.

Preferably also, the switch includes means for bypassing said transistor when the switch is "on".

Preferably also, said sensor means comprises an induction coil, an oscillator connected to drive the coil, and a level detector connected to the oscillator to provide a detector output signal in response to reduction in the amplitude of oscillation caused by proximity of a metallic object to the coil.

According to a second aspect of the invention, a proximity switch for use with an AC supply to control a load connected in series with the switch comprises:

a power supply including a storage capacitor;
an induction coil;
an oscillator connected to drive the coil;
a level detector connected to the oscillator to provide a detector output signal in response to reduction in the amplitude of oscillation caused by proximity of a metal object to the coil; and a controllable switching element connected, in use, across said A.C. supply and having a control input;

characterised by time delay means for overriding said level detector upon initial application of said A.C. supply so as to prevent generation of a detector output signal until a predetermined period of time has elapsed.

Preferably, said time delay means includes a controlled conduction device connected so as to clamp the output of said level detector to a predetermined level and thereby prevent the generation of an output signal.

Preferably also, said controlled conduction device is a transistor whose base-emitter voltage is controlled such that the transistor switches off after a predetermined period of time, enabling the level detector to operate normally.

Preferably also, said controlled conduction device is responsive to timing means comprising a capacitor.

Figure 2:
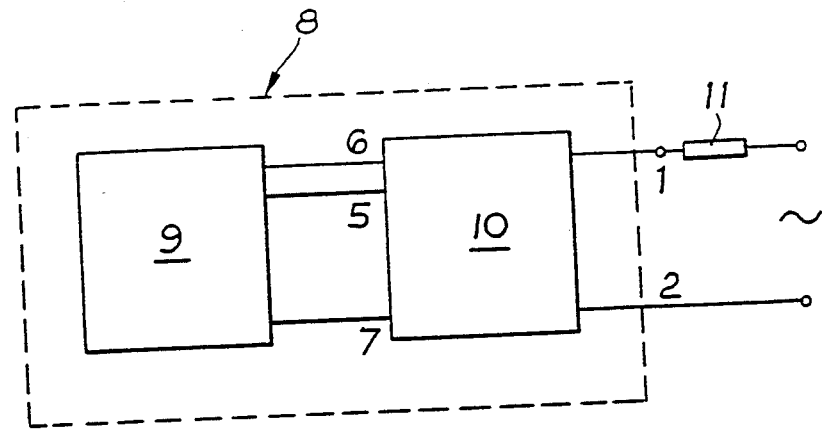

An embodiment of the invention will now be described, by way of example only, with reference to the accompanying drawings in which FIG. 1 is a circuit diagram of an inductive type proximity switch circuit embodying the invention, and FIG. 2 is a block diagram illustrating the application of the invention to proximity switches utilising sensors of other types.

Referring now to the FIG. 1, an inductive type proximity switch circuit embodying the invention includes a full-wave rectifier bridge BR1 connected to an A.C. supply voltage via terminals 1 and 2 and an externally connected series load (not shown), and means for sensing the presence of a metal object in proximity to the switch comprising an induction coil L1 driven by an oscillator circuit comprising transistors T1 and T2, capacitor C1 and resistors R1, R2 and R3.

The presence of a metal object in proximity to the coil L1 loads the oscillator and reduces the amplitude of the oscillation. This reduction of amplitude is sensed by a level detector circuit comprising transistor T3, capacitor C4, resistors R4, R6 and R7 and light-emitting diode (l.e.d.) 1L1. The l.e.d. 1L1 provides a visual indication of the state of the switch.

When the switch is "on", a thyristor TH1 conducts causing current to flow through the external load.

Power for the low voltage powered circuitry is provided by a power supply circuit including capacitor C7 and zener diode Z1.

The operation of the circuit will now be described, firstly considering the case where the A.C. supply voltage is applied to the terminals 1 and 2 with no target object present.

The A.C. supply voltage is applied to the terminals 1 and 2 from an external source (via the externally connected series load) and is rectified by the bridge rectifier BR1 so that a D.C. voltage appears across points 3 and 4, point 3 being positive. The gate of MOSFET T11 is now forward biased by the voltage applied via resistor R21, allowing current to flow along the path 3, drain-source of T11, diodes D1A and D1B, resistor R20, capacitor C7, 4.

The amount of current that can flow is limited by the amount that can pass through R20 before the voltage developed across R20 is sufficient to cause the base-emitter of transistor T10 to be forward biased. At this point, T10 will turn on and current will flow from 3, through R21, collector-emitter of T10 and C7 before returning to 4. At some stage the current flowing will be great enough to result in the voltage drop across R21 being sufficient to starve the gate of T11 of sufficient voltage to maintain T11 in full drain-source conduction.

The net result is that the current charging capacitor C7 is limited to a pre-set value, typically 1.5 mA.

The voltage across C7 will rise until zener diode Z1 conducts via resistor R19 and base-emitter of transistor T8.

The voltage across C7 then forms the power supply voltage for the low voltage powered circuitry. The value is typically 6V and the circuit is designed to maintain this voltage for an input A.C. supply voltage in the range 20 to 264 volts.

It can be seen then, that as the maximum level of the C7 charging current is limited, any switch on surge registered in the external load is limited to this low value. The capacitors C7 and C5 constitute a storage medium to maintain the voltage at a relatively constant level during the time that the A.C. supply voltage falls to zero at each half cycle.

The case where the circuit is detecting a metal object will now be considered.

When a target object is detected, the voltage at point 5 rises positively with respect to 4. This results in current flowing in the path 5, R12, R13, R14, 4. The voltage drop across R14 is sufficient to forward bias the gate-cathode of thyristor TH1, switching TH 1 to the "on" state. Load current will then flow from the external A.C. voltage source, through the external load and bridge BR1, and hence from point 3, through the anode-cathode of TH1, and return to the supply via 4 and BR1.

At the same time that the voltage at 5 rises positively, transistor T6 base-emitter will be forward biased via R11, causing T6 to turn on.

At the instant that thyristor TH1 switches into conduction, the voltage between points 3 and 4 collapses almost to zero, the A.C. supply voltage now being developed across the external load. This state will be maintained until the supply current approaches zero when the thyristor TH1 will automatically switch off. The voltage across 3 and 4 will then increase as the A.C. supply increases on the next half-cycle.

Since T6 is now turned on, the base-emitter of transistor T9 is forward biased and the emitter-collector of T9 conducts. Accordingly, the current to operate the power supply (i.e. the C7 charging current) now follows the path 3, T11 drain-source, D1A, T9 emitter-collector, C7, 4. Thus, T9 effectively by-passes the current limiter transistor T10, enabling the power supply capacitor C7 to charge rapidly. The time taken for the voltage across C7 to reach the breakdown voltage of the zener diode Z1 is therefore kept to a minimum, resulting in a relatively low on-state voltage being developed across the terminals 1 and 2.

When the breakdown voltage of Z1 is reached, current will flow into R19 and transistor T8 will become forward biased, turning on T8 and thereby turning off transistor T7. Upon T7 turning off, current will be allowed to flow into the gate of thyristor TH1 via R12 and R13, and TH1 will again switch into conduction. This process is repeated each half-cycle of the supply voltage.

A second zener diode Z2 protects the gate of the MOSFET T11 from excessive voltage.

Diode D1A prevents discharge of C7 at the time that thyristor TH1 conducts. Without D1A, C7 would discharge via T9 (reverse biased collector-emitter), the internal diode of T11 (shown in broken lines), TH1 anode-cathode and back to the negative terminal of C7.

Diode D1B is included to ensure that the base of T10 is starved of current while T9 is conducting.

The proximity switch circuit further includes a circuit comprising transistor T4, resistors R5 and R8 and capacitor C3 to override the oscillator and level detector circuitry until that circuitry has stabilised its working point after initial application of the supply voltage. If this was not included, the thyristor TH1 could receive a false "on" signal with no metal target object present.

When the power supply first builds up following application of the A.C. voltage, C3 charges up via R8, R5 and T4 base-emitter. T4 switches on, thereby clamping the base of T5 to point 6. This ensures that T5 cannot turn on and supply a positive voltage level to point 5.

After a predetermined time, the current flowing in C3 will reduce to a sufficiently low value for T4 to turn off, this enabling T5 to operate normally.

The power supply circuitry described above may also be applied to proximity switches utilising other types of sensor head, as will now be described with reference to FIG. 2 which shows a block diagram of a proximity switch 8, connected to an ac supply via a series load 11, and comprising sensor means 9 and a power supply and output stage 10. Reference numerals 1, 2, 5, 6 and 7 correspond to those of FIG. 1.

The circuitry contained within block 10 is identical to that of FIG. 1 to the right of points 5, 6 and 7. The power supply stage embodying the invention may thus be coupled to other types of sensor (such as the Siemens TCA 305 or alternative) by connecting lines 5 and 6 across the sensor output, line 7 being a ground line.

I claim:

1. A proximity switch for use with an AC supply to control a load connected in series with the switch comprising:
    a low voltage power supply circuit including a storage capacitor (C7) and a Zener Diode (Z1);
    a sensor means for generating an output signal in the presence of a sensed target connected to said low voltage power supply circuit;
    a controllable switching element (TH1) connected, in use, across said AC supply and having a control input connected to the sensor output signal;
    said low voltage power supply including means for limiting a current charging said storage capacitor (C7) to a predetermined maximum value when the switch (TH1) is "off";
    characterized in that said current limiting means includes a variable resistance device (T11) connected in series with said storage capacitor (C7) and means (R21, T10, R20) responsive to the level of the charging current for controlling the resistance of said device.

2. A proximity switch as claimed in claim 1, in which said variable resistance device is a MOSFET and said charging current responsive means controls the MOSFET gate voltage, as a function of said charging current.

3. A proximity switch as claimed in claim 2 wherein said means for controlling the gate voltage of said MOSFET includes a transistor, the base-emitter voltage of said transistor being proportional to the charging current of said storage capacitor.

4. A proximity switch as claimed in claim 1, further including means for by-passing said charging current responsive means when the switch is "on".

* * * * *